United States Patent
Tsai et al.

(10) Patent No.: US 7,549,103 B2
(45) Date of Patent: Jun. 16, 2009

(54) DATA ENCODING METHOD FOR ERROR CORRECTION

(75) Inventors: Ming-Chang Tsai, Hsinchu (TW); Che-Kuo Hsu, Hsinchu (TW); Kuo-Hsin Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 633 days.

(21) Appl. No.: 11/431,787

(22) Filed: May 10, 2006

(65) Prior Publication Data

US 2007/0136636 A1 Jun. 14, 2007

(30) Foreign Application Priority Data

Dec. 21, 2005 (TW) .............................. 94145604 A

(51) Int. Cl.
*H03M 13/00* (2006.01)
(52) U.S. Cl. ...................................... 714/752; 714/755
(58) Field of Classification Search ............. 369/59.25; 714/758, 701, 762, 752, 755
See application file for complete search history.

(56) References Cited

U.S. PATENT DOCUMENTS

| | | | | |
|---|---|---|---|---|
| 4,688,225 A | * | 8/1987 | Fukami et al. | 714/755 |
| 5,170,400 A | * | 12/1992 | Dotson | 714/755 |
| 6,772,386 B2 | * | 8/2004 | Iwata et al. | 714/755 |
| 7,162,678 B2 | * | 1/2007 | Saliba | 714/758 |
| 7,376,066 B2 | * | 5/2008 | Sakagami | 369/59.25 |
| 7,401,268 B2 | * | 7/2008 | Noda et al. | 714/701 |
| 7,404,111 B2 | * | 7/2008 | Noda et al. | 714/701 |
| 7,406,635 B2 | * | 7/2008 | Noda et al. | 714/701 |

FOREIGN PATENT DOCUMENTS

| | | |
|---|---|---|
| TW | I227869 | 2/2005 |
| TW | I235911 | 7/2005 |

* cited by examiner

*Primary Examiner*—David Ton
(74) *Attorney, Agent, or Firm*—Morris, Manning & Martin LLP; Tim Tingkang Xia

(57) ABSTRACT

A data encoding method for error correction is provided. Before recording data into a recording media, the data are added with an Error Correction Code (ECC) comprising Check Sum on Row (CSR) and Check Sum on Column (CSC), thereby forming an ECC block. More than one ECC block are integrated into a data matrix, to resist longer burst errors of data. Finally, the data matrix is divided into several sectors and individual sector address information is added for each sector, thereby finishing the encoding process.

10 Claims, 14 Drawing Sheets

| | DVD ECC | First type of high efficiency encoding block | Second type of high efficiency encoding block | Third type of high efficiency encoding block |
|---|---|---|---|---|
| Coding Gain | 0.872 (192x172) / (208x182) | 0.859 (225x228) / (237x252) | 0.878 (192x171x2) / (210x178x2) | 0.904 (192x171x2) / (204x178x2) |
| Burst Error Length | 2912 bytes (182x16) | 6399 bytes (237x27) | 6408 bytes (178x18x2) | 4272 bytes (178x12x2) |
| One Time ECC Correction Rate | 11.24% (192x5+172x16) / (192x172) | 13.75% (225x4+228x27) / (225x228) | 11.13% (192x3x2+171x18x2) / (192x17x2) | 8% (192x3x2+171x12x2) / (192x171x2) |

FIG. 7

|  | HD-DVD ECC | First type of high efficiency encoding block | Second type of high efficiency encoding block | Third type of high efficiency encoding block |
|---|---|---|---|---|
| Coding Gain | 0.872 (192x172x2) / (208x182x2) | 0.859 (225x228) / (252x237) | 0.878 (192x171x2) / (210x178x2) | 0.904 (192x171x2) / (204x178x2) |
| Burst Error Length | 5824 bytes (182x16x2) | 6399 bytes (237x27) | 6408 bytes (178x18x2) | 4272 bytes (178x12x2) |
| One Time ECC Correction Rate | 11.24% (192x5x2+172x16x2)/(192x172x2) | 13.75% (225x4+228x27) / (225x228) | 11.13% (192x3x2+171x18x2) / (192x171x2) | 8% (192x3x2+171x12x2) / (192x171x2) |

FIG. 8

DATA ENCODING METHOD FOR ERROR CORRECTION

CROSS-REFERENCE TO RELATED APPLICATIONS

This non-provisional application claims priority under 35 U.S.C. § 119(a) on Patent Application No(s). 094145604 filed in Taiwan, R.O.C. on Dec. 21, 2005, the entire contents of which are hereby incorporated by reference.

BACKGROUND OF THE INVENTION

1. Field of Invention

The present invention relates to a method for correcting errors of encoding data, more particularly, to an encoding method with higher efficiency on recording capacity and error correction rate.

2. Related Art

Generally, in order to record data into a recording media efficiently and protect the data properly, the data have been encoded through a specific encoding process before being recorded.

Generally, in a conventional encoding process, main data is read firstly; then an ID, an ID Error Detection Code (IED), and a Content Protection for Recordable Media (CPRM) are added in front of the main data; after that, an Error Detection Code (EDC) is added into the main data; then the main data is scrambled; two Error Correction Codes (ECC), Parity Inner (PI) and Parity Outer (PO), are respectively added into rows and columns to form a block, referred to as an ECC block. Generally speaking, the longer the parity, the stronger the ability of error correction, and the greater the amount of error that can be corrected.

As for a Digital Versatile Disc (DVD) system, referring to FIG. 1, it is an encoding format of an ECC block for a conventional DVD system. The length of a row in the main data block is 172 bytes, and there are totally 192 rows, i.e., the main data can accommodate 192×172=33024 bytes, and further comprises individual sector addresses for separating the main data block into several sectors. The PI of 10 bytes and the PO of 16 bytes are added into each column and each row of the main data block respectively.

The more the parity placed in a disc is, the less user data that can be recorded is. Therefore, how to design a High Coding Rate ECC (HR-ECC) block becomes a key point provided in the present invention.

SUMMARY OF THE INVENTION

In view of the above problems, a main object of the present invention is to provide a method for correcting errors of encoding data, and provide three types of ECC block designs with higher coding rate and the ability to correct longer burst error.

Therefore, in order to achieve the above object, a method for correcting errors of encoding data disclosed in the present invention should comprise at least the following steps.

Firstly, each row of a data block to be recorded is added with a Check Sum on Row (CSR) and each column is added with a Check Sum on Column (CSC). Then, several encoded data blocks are combined to form a data matrix so as to enhance the longer burst error length. Next, the data matrix is divided into sectors with each sector having a fixed number of columns, and then sector address information is added in front of each of the sectors. And finally, the encoded data is recorded into a recording media.

According to the method disclosed in the present invention, the sector address information will never be subsumed in ECC encoding, so as to further enhance the error correction ability of main data block. Furthermore, the present invention provides three types of encoding block formats, which are used in different recording condition, thereby recording data more flexibly.

The features and practices of the present invention will be illustrated below in detail by the preferred embodiments with the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein:

FIG. 7 is a comparison table of the efficiency of the ECC encoding block of the present invention and a DVD with red laser; and FIG. 8 is a comparison table of the efficiency of the ECC encoding block of the present invention and a HD-DVD with blue laser.

DETAILED DESCRIPTION OF THE INVENTION

The present invention discloses a data encoding method for error correction and three types of encoding block formats. In the following detailed illustration of the present invention, various specific details will be described to illustrate the present invention perfectly. However, those skilled in the art may implement the present invention without using the specific details, or implement the present invention through alternative elements or methods. Under other conditions, known methods, processes, members, and circuits will not be illustrated in specific detail, so as not to confuse the key points of the present invention.

Figure 1:
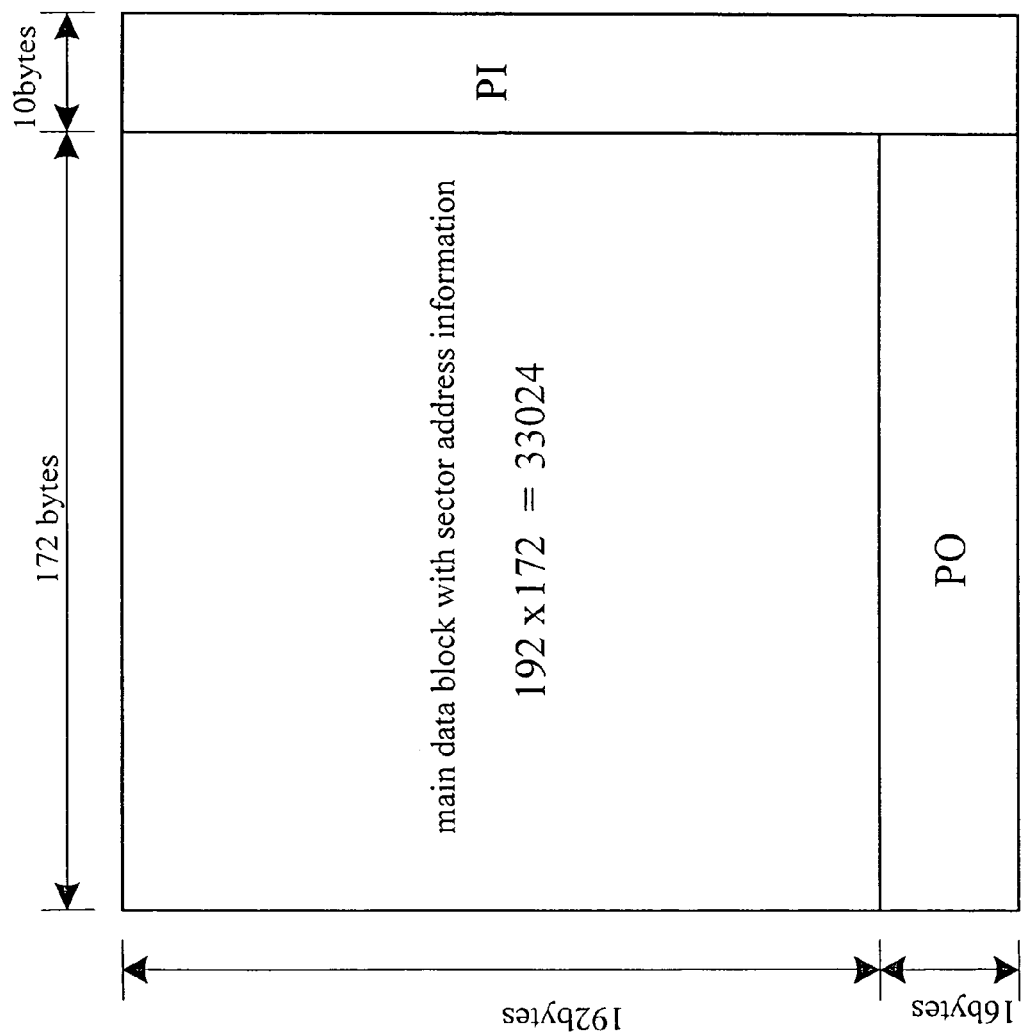
FIG. 1 is a schematic view of an ECC block format of a conventional DVD.
Figure 2:
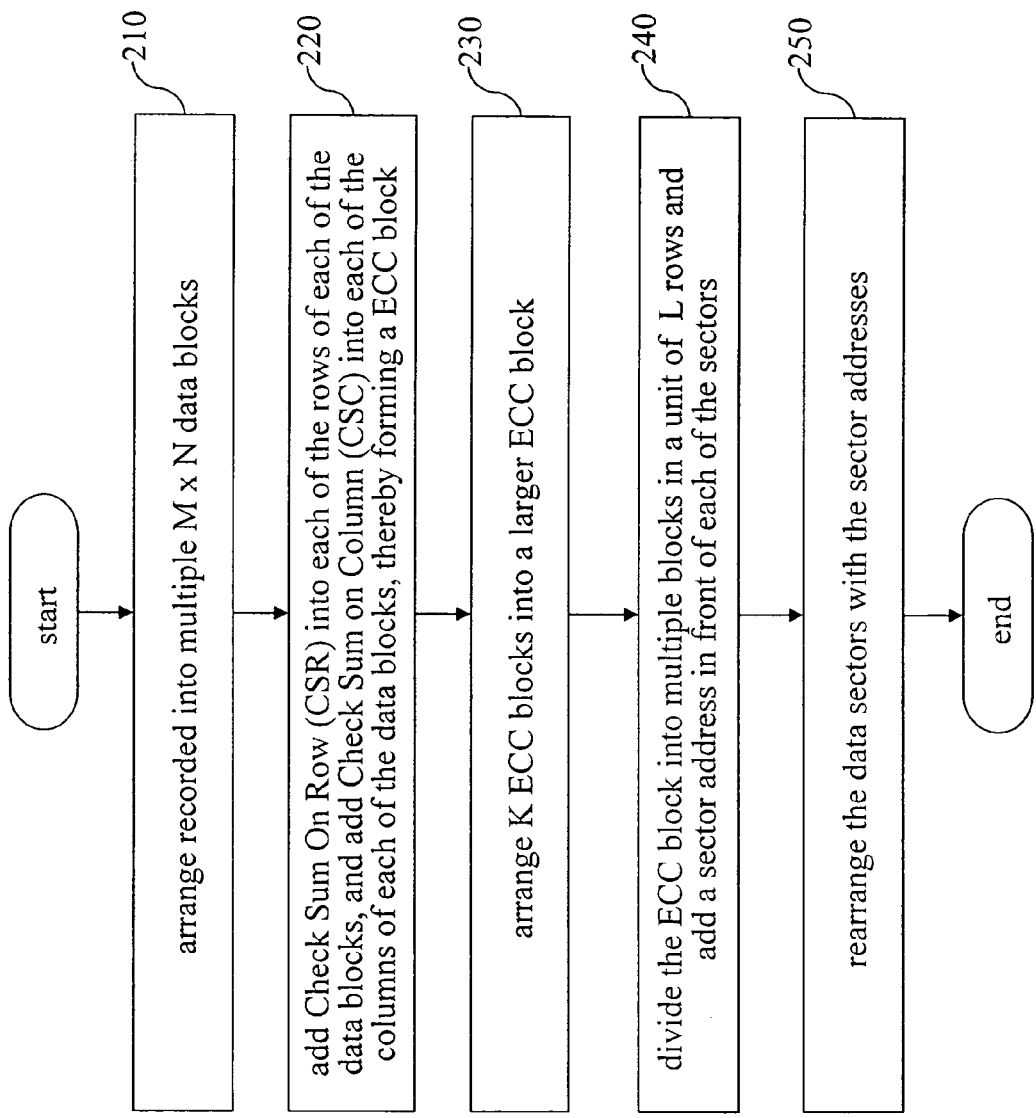
FIG. 2 is a flow chart of the method of the present invention.
Figure 3A:
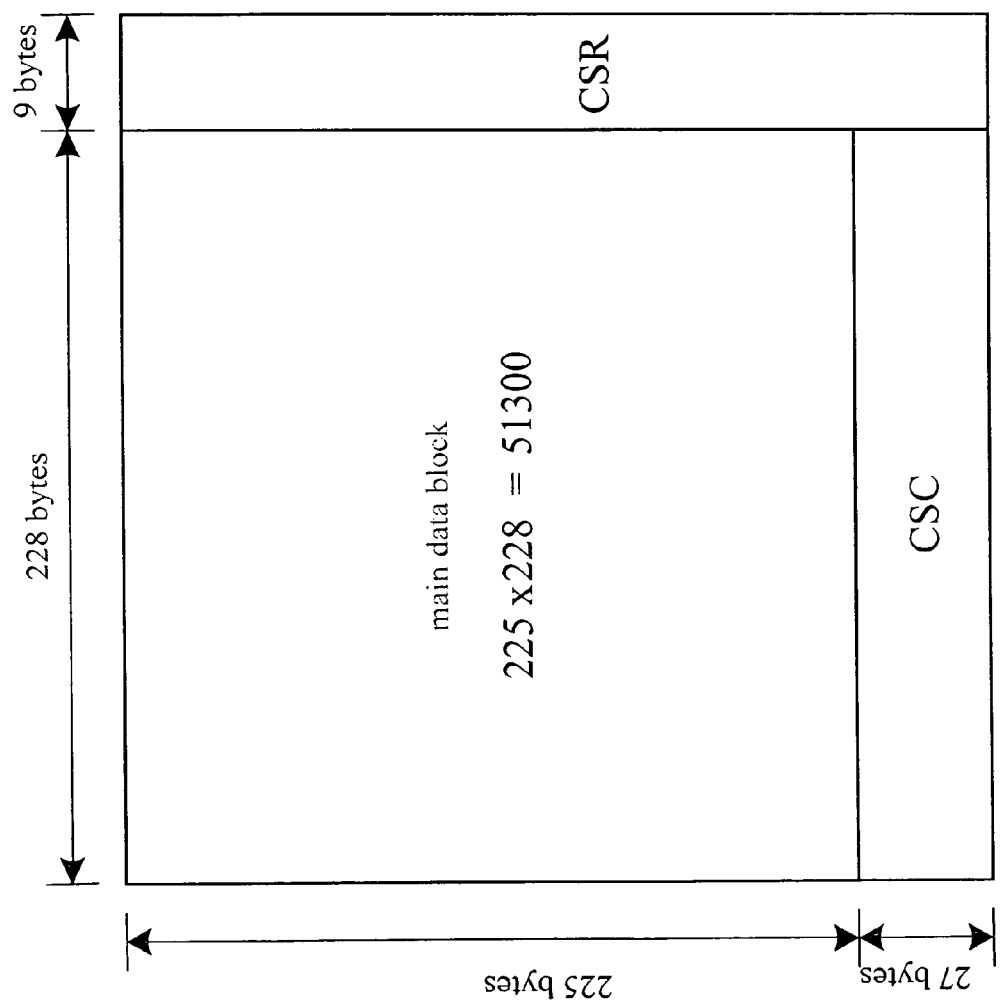
FIG. 3a is a schematic view of the present invention after a first type of HR-ECC block is added with a parity code.

Referring to FIG. 2, it is a flow chart of the method of the present invention, illustrated by taking the first type of HR-ECC block as an example. Referring to FIG. 3a, in the process of encoding, firstly, the data to be recorded is arranged into a data block. The data length N of each row in the data block is 228 bytes, i.e. there are N columns, and the data length M of each column is 225 bytes, i.e. there are M rows, thereby forming a 225×228 data block (Step 210).

Each column and row are executed the parity encoding, wherein each Check Sum on Row (CSR) occupies 9 bytes, and each Check Sum on Column (CSC) occupies 27 bytes (Step 220). The parity encoding is used to find out the locations of occurred errors while reading data, and further to correct the erroneous data. Therefore, the longer the parity encoding, the better the correction capability, and the greater the amount of data that can be corrected.

As for a Reed-Solomon (RS) code, in the decoding process of the erroneous data, generally, the amount of the erroneous data that can be corrected is half of that of the parity code. For example, if the length of CSC is 27 bytes, at most 13 bytes of erroneous data can be corrected, and therefore when the number of error in a row is more than 13 bytes, the erroneous data cannot be corrected. However, if the location of the error has been known in the process of decoding, the amount of the erroneous data that can be corrected is increased to 27 bytes, called erasure decoding. When occurring burst errors, the erroneous data cannot be corrected by CSR. However, the locations of the errors can be marked in advance through CSR, so as to enhance the correction ability of CSC to 27 bytes by erasure decoding. Therefore, taking the first type of high efficiency encoding block as an example, the tolerable amount of burst errors can be 237×27=6399 bytes.

In order to enhance the ability of correcting burst errors, the two ECC blocks added with CSR and CSC are integrated into a new ECC block, wherein each ECC block maintains its original decoding ability, such that the amount of the burst errors that can be corrected is two times more than that of one ECC block. Therefore, if K ECC blocks are integrated, the amount of the burst errors that can be corrected is K times more than that of one ECC block (Step 230).

Figure 3B:
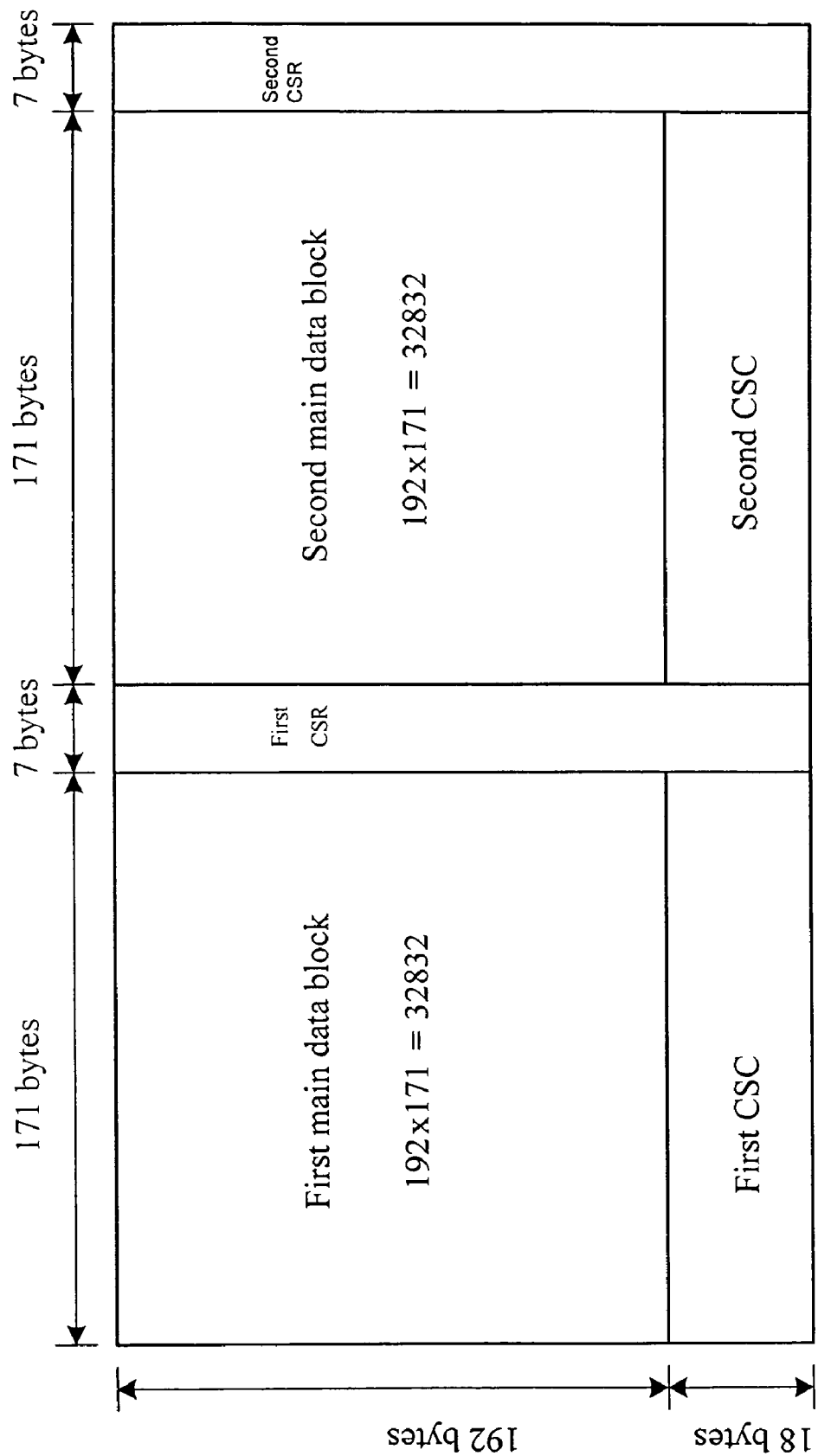
FIG. 3b is a schematic view of the present invention after a second type of HR-ECC block is added with the parity code.

However, for the limited space of the recording media, the more the parity codes are recorded, the less the recorded data can be recorded. Therefore, the present invention further discloses a second type of HR-ECC block. Referring to FIG. 3b, as compared with the first type of HR-ECC block, the data format is formed by two 210×178 ECC blocks, wherein the recorded data is a 192×171 data block, each CSR only occupies 7 bytes, and each CSC only occupies 18 bytes. The tolerable amount of the burst errors of single ECC block is only 178×18=3204 bytes, then after the two ECC blocks are integrated, the tolerable amount of the burst errors is 178×18×2=6408 bytes, close to that of the first type of HR-ECC block.

Figure 3C:
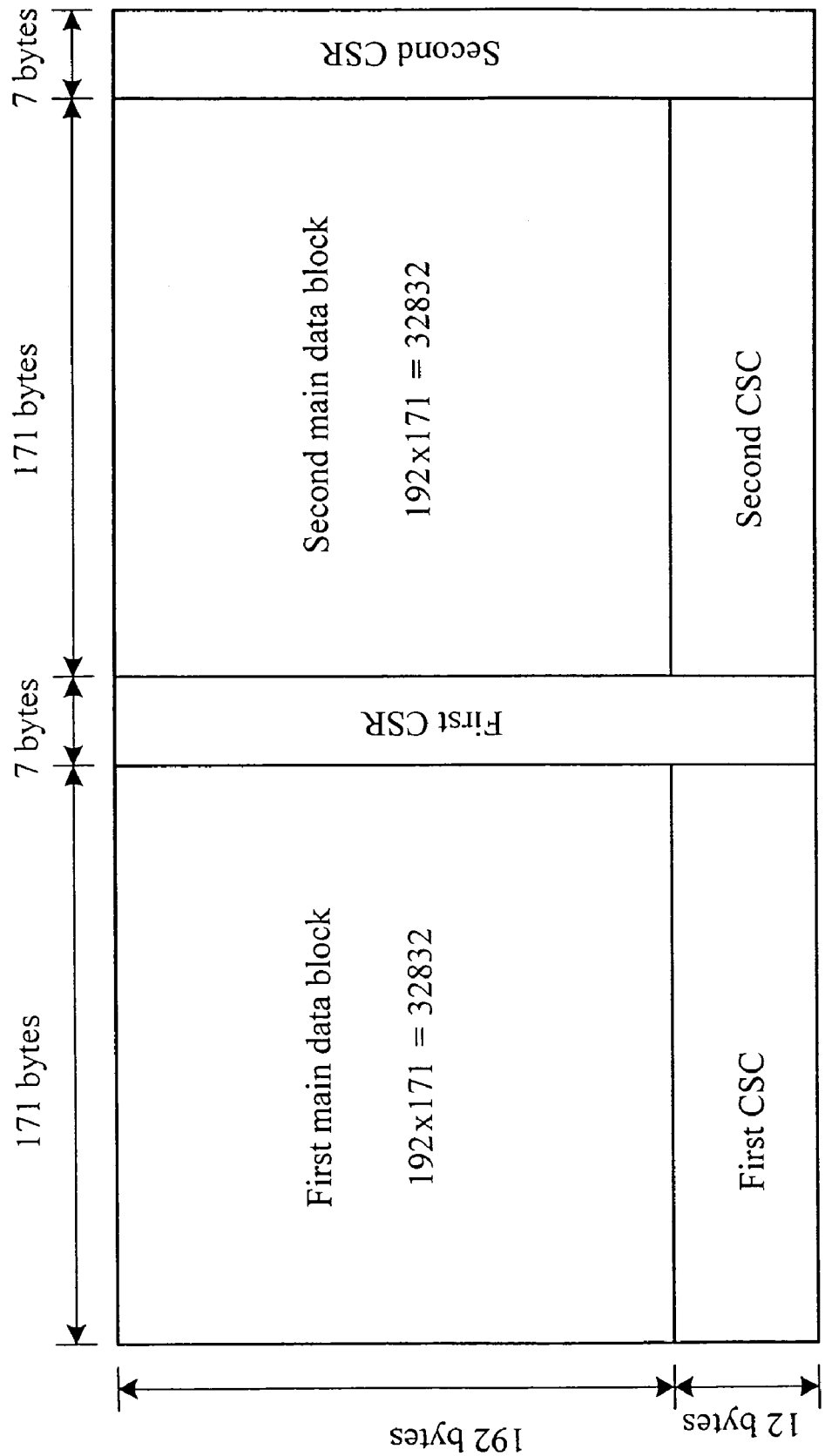
FIG. 3c is a schematic view of the present invention after a third type of HR-ECC block is added with the parity code.

Additionally, the present invention also discloses a third type of HR-ECC block, as shown in FIG. 3c. Compared with the second type of HR-ECC block, in such data format, each CSC of the third HR-ECC block only occupies 12 bytes. Though the correction capability is reduced a little, the data format may be used to record audiovisual data that could tolerate more errors. The second type of HR-ECC block is more suitable for protecting important data, such as file systems.

Figure 4A:
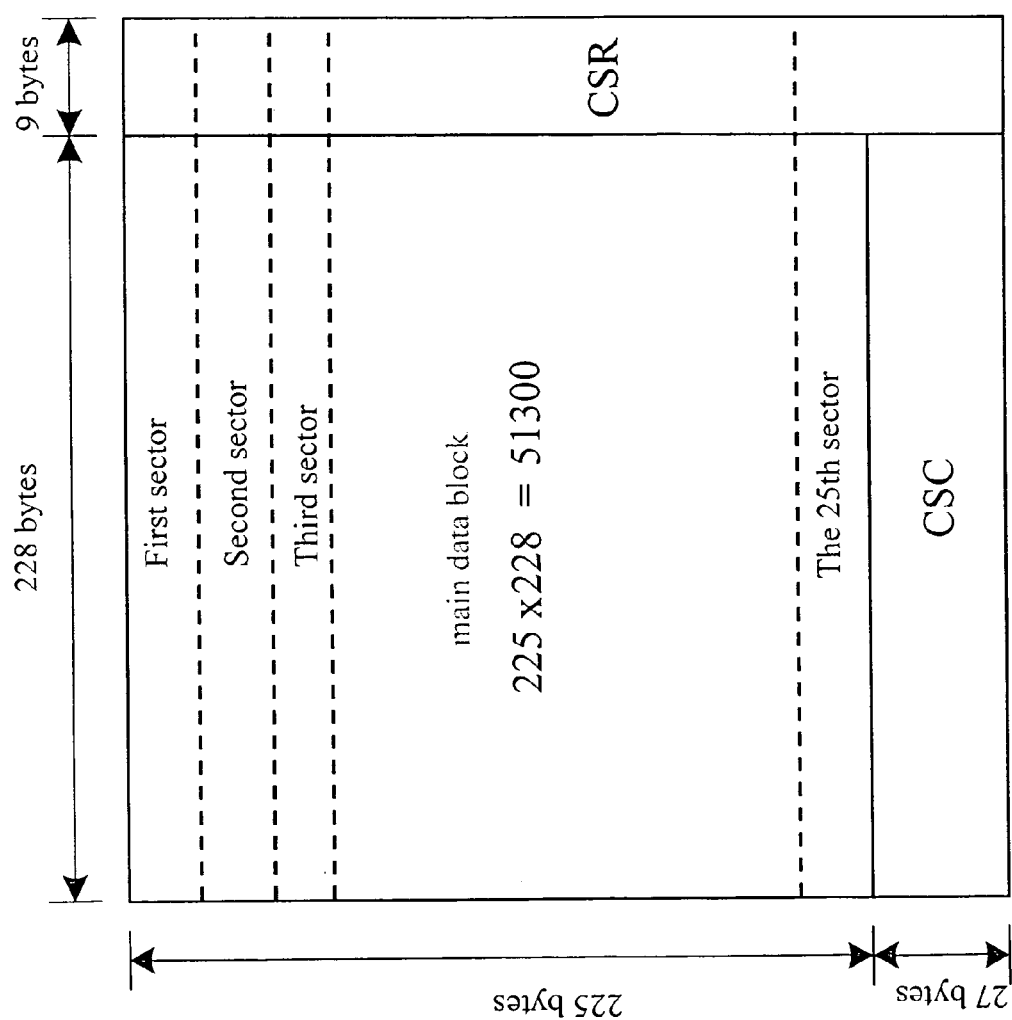
FIG. 4a is a schematic view of the present invention after the first type of HR-ECC block is divided into multiple sectors.
Figure 4B:
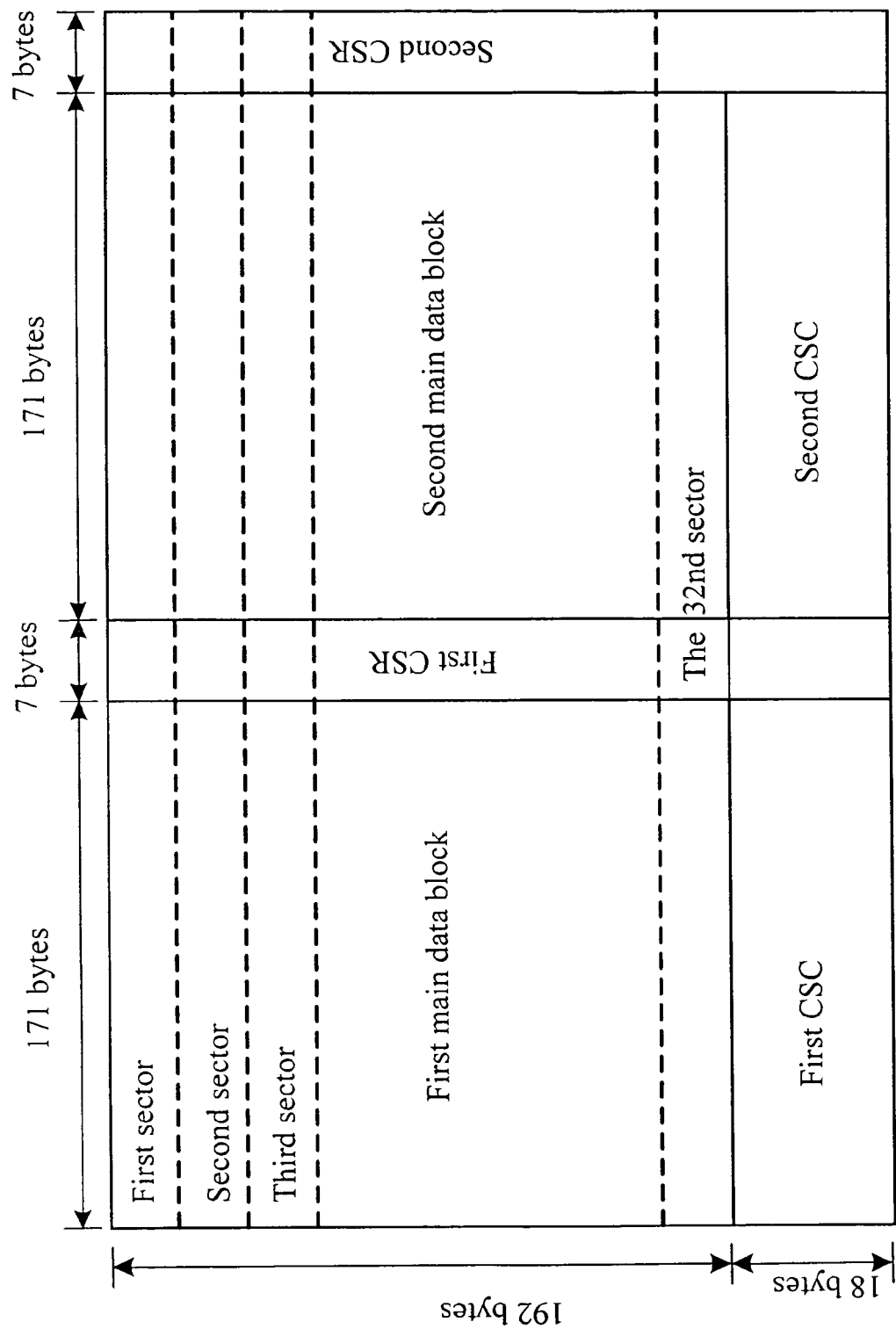
FIG. 4b is a schematic view of the present invention after the second type of HR-ECC block is divided into multiple sectors.
Figure 5A:
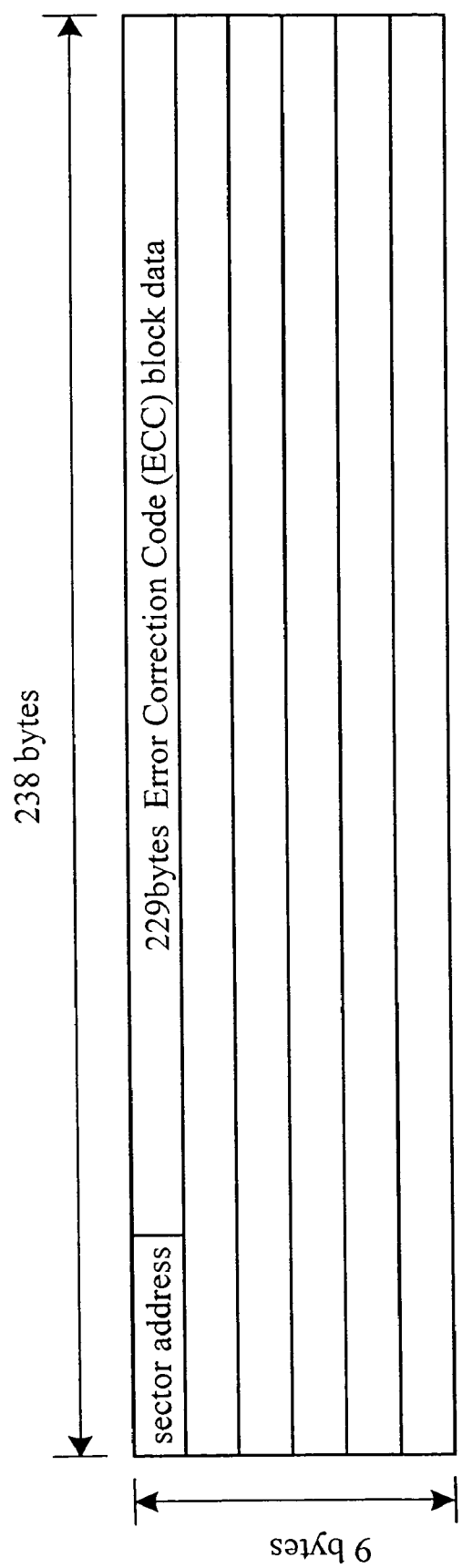
FIGS. 5a and 5b are schematic views of the present invention after a sector is added with a sector address.
Figure 5B:
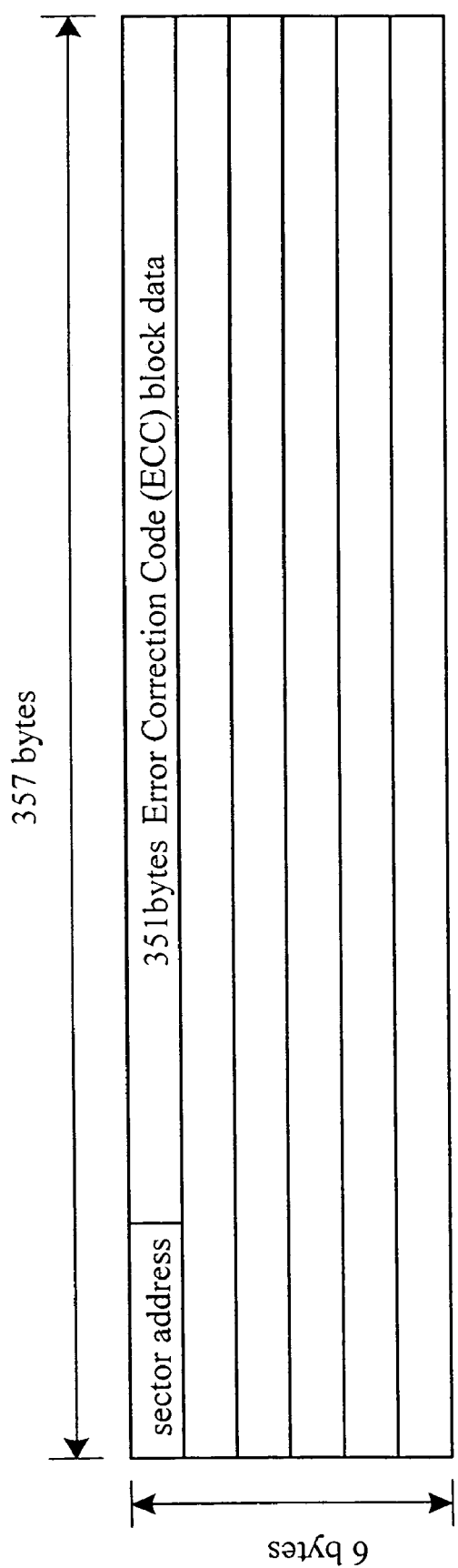

CSR and CSC are added into the data block, as shown in FIGS. 4a and 4b, then the ECC block is divided into multiple sectors, wherein each sector is formed in a fixed unit number of rows, supposed to be L. Therefore, the first type of HR-ECC block is divided into 28 sectors, wherein each sector is formed in a unit of 9 rows, and the second and third types of HR-ECC blocks are divided into 35 and 34 sectors respectively, wherein each sector is formed in a unit of 6 rows. An address label is added in front of each sector, so as to recognize each sector belonging to which location in the HR-ECC block (Step 240). As shown in FIG. 5a, it is a schematic view of a sector of the first type of HR-ECC block after a sector address is added. Before the sector address is added into the original data format, the data length of the row is (228+9)=237 bytes, and after the sector address is added, the length becomes (228+9+1)=238 bytes. Additionally, as shown in FIG. 5b, it is a schematic view of a sector of the second and third types of HR-ECC blocks after a sector address is added. Before the sector address is added into the original data format, the data length of the row is (171+7)×2=356 bytes, and after the sector address is added, the length becomes (171+7)×2+1=357 bytes.

Figure 6A:
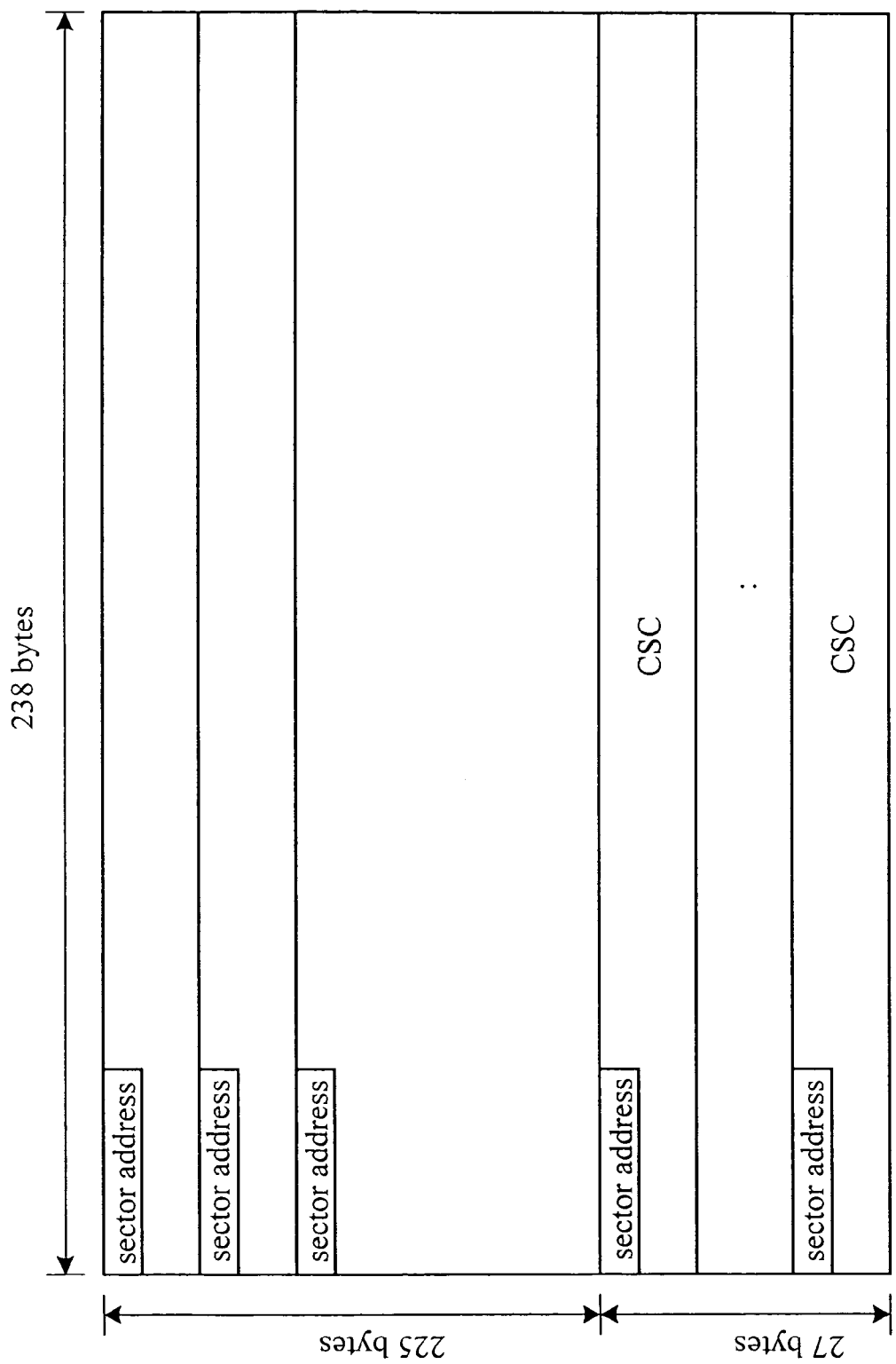
FIG. 6a is a schematic view of the present invention after the first type of HR-ECC block is added with the sector address.
Figure 6B:
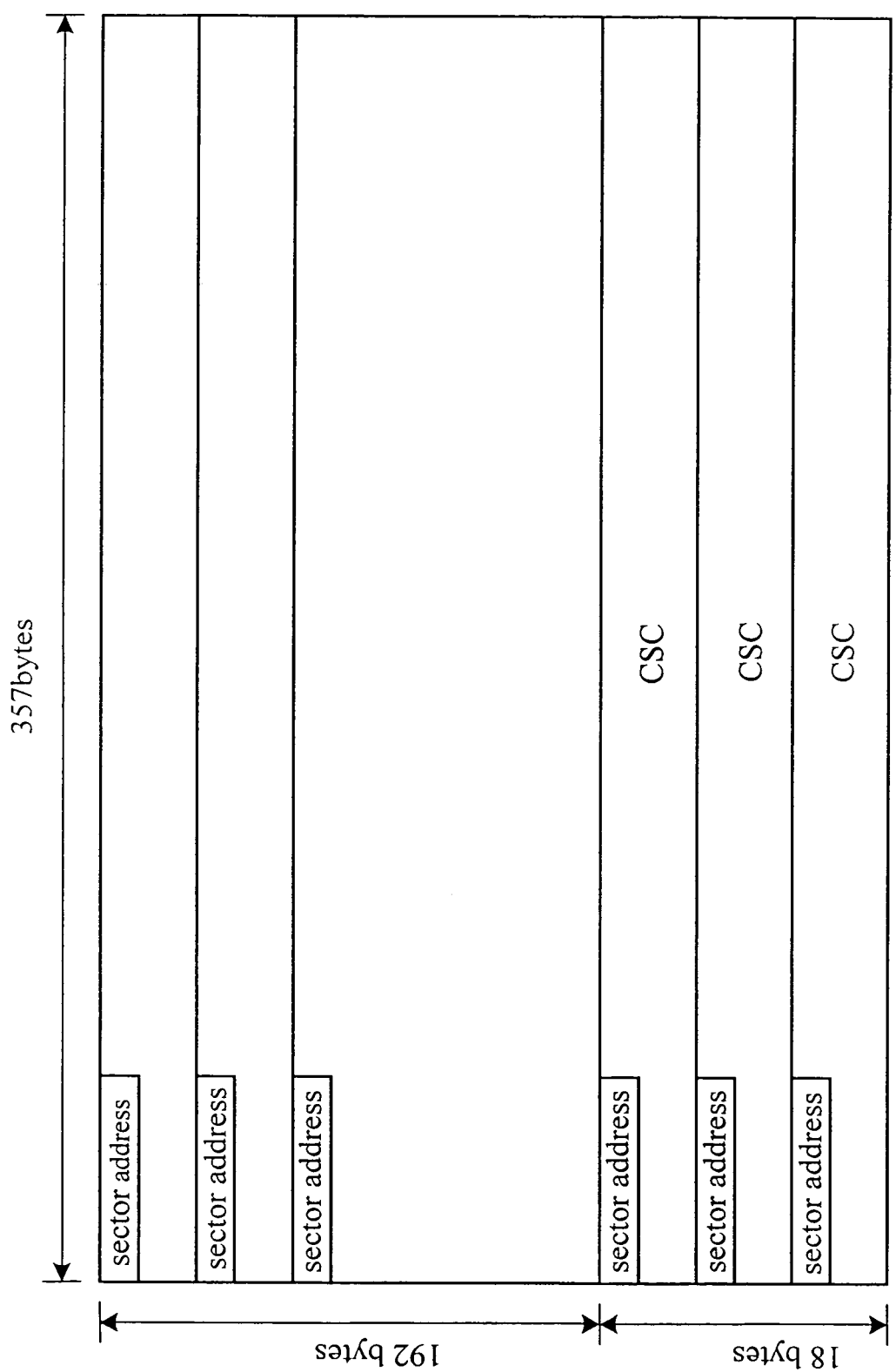
FIG. 6b is a schematic view of the present invention after the second type of HR-ECC block is added with the sector address.
Figure 6C:
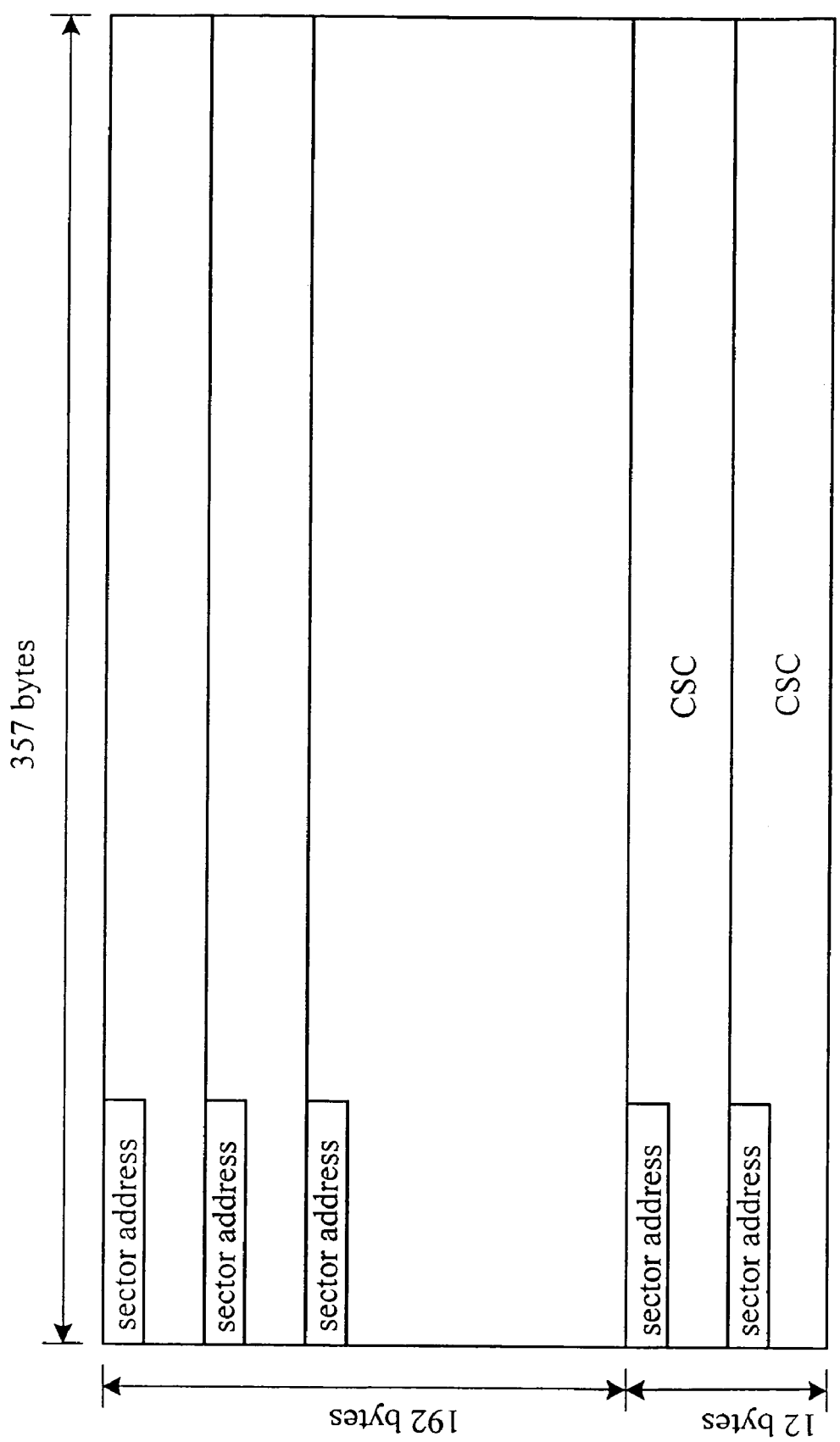
FIG. 6c is a schematic view of the present invention after the third type of HR-ECC block is added with the sector address.

Through the sector address configuration, the data can be read and recognize more properly and conveniently. Since the sector address is added in front of the original data, the location of the original data will be moved backward. Taking the first type of HR-ECC block as an example, after the sector address of 9 bytes is added in front of the first row of 237 bytes, 229 bytes remained can be allocated for the ECC block data. In a similar way, after the equal division, i.e. the data length of the row of an original sector becomes 238 bytes instead of 237 bytes. Taking the second and third types of HR-ECC blocks as examples, after a sector address of 6 bytes is added in front of the first row of the ECC data block of 356 bytes, 351 bytes remained can allocated for the ECC block data. In a similar way, after the equal division, i.e. the data length of the row of an original sector becomes 357 bytes instead of 356 bytes (Step 250). After the sector address is added, the data formats of the first, second, and third types of high efficiency encoding blocks are respectively shown in FIGS. 6a, 6b, and 6c.

The performance of three encoding formats disclosed by the present invention are compared with that of DVD and High-Definition DVD (HD-DVD), as shown in FIGS. 7 and 8, respectively. The encoding efficiency may be expressed through three characteristics, i.e. Coding Gain, Burst Error Length, and One Time ECC Correction Rate. Coding Gain indicates the proportion of data can be protected in the capacity of an ECC block. Burst Error Length indicates the length of the successively damaged data that can be corrected for a scraped disk. One Time ECC Correction Rate indicates the rate between the size of the data in the ECC block and the maximum size of the data that can be corrected when a great number of random errors appear. For the performance of the ECC block of DVD, as shown in FIG. 7, Coding Gain is 0.872, Burst Error Length is 2912 bytes, and One Time ECC Correction Rate is 11.24%.

For the first type of HR-ECC block proposed by the present invention: Coding Gain is 0.859, Burst Error Length is 6399 bytes, and One Time ECC Correction Rate is 13.75%, wherein Coding Gain is slightly smaller than that of DVD, even so, the later two values are better than those of DVD. For the second type of HR-ECC block: Coding Gain is 0.878, Burst Error Length is 6408 bytes, and One Time ECC Correction Rate is 11.13%, wherein the encoding style is similar to that of DVD, however the former two values are better than those of DVD. For the third type of HR-ECC block: Coding Gain is 0.904 which is obviously larger than the encoding style of DVD and indicates that more data can be recorded with the same size of the ECC block, Burst Error Length is 4272 bytes which is better than that of DVD, and One Time ECC Correction Rate is 8%.

Compared with HD-DVD, as shown in FIG. 8, Coding Gain is 0.872 which is the same with that of DVD, Burst Error Length is 5824 bytes, and One Time ECC Correction Rate 11.24%.

For the first type of HR-ECC block: Coding Gain is 0.859, Burst Error Length is 6399 bytes, and One Time ECC Correction Rate is 13.75%, wherein Coding Gain is slightly smaller than that of HD-DVD, even so, the later two values are better than those of HD-DVD. For the second type of HR-ECC block: Coding Gain is 0.878, Burst Error Length is 6408 bytes, and One Time ECC Correction Rate is 11.13%, the former two values are better than those of HD-DVD. For the third type of HR-ECC block: Coding Gain is 0.904 which is obviously larger than the ECC block of HD-DVD and indicates that more data can be recorded in the same ECC block, Burst Error Length is 4272 bytes, and One Time ECC Correction Rate is 8%.

Since the three types of ECC encoding method provided by the present invention have different correction capability, respectively. In practice, the encoding formats of the three types of ECC may be mix to record data in the same recording media. The second type of HR-ECC block with stronger correction capability is used to protect important data, such as file system, and the third type of HR-ECC block is used to record the data allowed for more errors, such as audiovisual data. If it will be expected to record more data in a disk without caring about the importance of the data, the third type of HR-ECC block can be used. On the other hand, if the importance of data will be more cared about, only the second type of HR-ECC block with stronger correction capability is used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A data encoding method for error correction, comprising:
   arranging recorded data into a plurality of M×N data blocks, wherein M is the number of row, and N is the number of column;
   adding a Check Sum on Row (CSR) of P bytes for each row of each M×N data blocks, and adding a Check Sum on Column (CSC) of Q bytes for each column of each M×N data blocks, thereby forming a (M+Q)×(N+P) Error Correction Code (ECC) block;
   arranging K times (M+Q)×(N+P) ECC blocks into one (M+Q)×(K(N+P)) ECC block, wherein K is a positive integer greater and equal than 1;
   dividing the (M+Q)×(K(N+P)) ECC block into a plurality of data sectors, wherein each data sector is formed in a unit of L rows and a sector address information with a length of L bytes is added in front of each data sector; and
   rearranging each data sector with the sector address information into a (M+Q)×(K(N+P)+1) data recording block.

2. The method as claimed in claim 1, wherein the CSR occupies a data length of 7 bytes.

3. The method as claimed in claim 1, wherein the CSR occupies a data length of 9 bytes.

4. The method as claimed in claim 1, wherein the CSC occupies a data length of 27 bytes.

5. The method as claimed in claim 1, wherein the CSC occupies a data length of 18 bytes.

6. The method as claimed in claim 1, wherein the CSC occupies a data length of 12 bytes.

7. The method as claimed in claim 1, wherein the (M+Q)×(K(N+P)) ECC block is divided into the plurality of sectors in a row unit length of 6 bytes.

8. The method as claimed in claim 1, wherein the (M+Q)×(K(N+P)) ECC block is divided into the plurality of sectors in a row unit length of 9 bytes.

9. The method as claimed in claim 1, wherein each the M×N data block is a 225×228 matrix.

10. The method as claimed in claim 1, wherein each M×N data block is a 192×171 matrix.

* * * * *